US009368216B2

(12) United States Patent
Tanzawa

(10) Patent No.: US 9,368,216 B2
(45) Date of Patent: Jun. 14, 2016

(54) INTERCONNECTIONS FOR 3D MEMORY

(71) Applicant: Micron Technology, Inc., Boise, ID (US)

(72) Inventor: Toru Tanzawa, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/813,711

(22) Filed: Jul. 30, 2015

(65) Prior Publication Data
US 2015/0340095 A1    Nov. 26, 2015

Related U.S. Application Data

(62) Division of application No. 13/774,522, filed on Feb. 22, 2013, now Pat. No. 9,111,591.

(51) Int. Cl.
*G11C 16/08* (2006.01)
*G11C 16/10* (2006.01)
*G11C 5/06* (2006.01)
*H01L 27/115* (2006.01)
*G11C 16/26* (2006.01)
*G11C 5/02* (2006.01)
*G11C 16/16* (2006.01)

(52) U.S. Cl.
CPC ....... *G11C 16/10* (2013.01); *G11C 5/02* (2013.01); *G11C 5/06* (2013.01); *G11C 5/063* (2013.01); *G11C 16/26* (2013.01); *H01L 27/11524* (2013.01); *H01L 27/11529* (2013.01); *H01L 27/11551* (2013.01); *G11C 16/08* (2013.01); *G11C 16/16* (2013.01)

(58) Field of Classification Search
CPC ......... G11C 16/08; G11C 16/10; G11C 16/16
USPC .............. 365/185.11, 185.18, 182, 51, 185.17
See application file for complete search history.

(56) References Cited

U.S. PATENT DOCUMENTS

| 5,707,885 | A | 1/1998 | Lim |
| 7,618,894 | B2 | 11/2009 | Bornstein et al. |
| 7,669,172 | B2 | 2/2010 | Ito et al. |

(Continued)

FOREIGN PATENT DOCUMENTS

| KR | 20110121332 | 11/2011 |
| KR | 1020120075882 | 7/2012 |

OTHER PUBLICATIONS

U.S. Appl. No. 13/543,154, entitled, "Stair Step Formation Using at Least Two Masks," filed Jul. 6, 2012, (46 pgs.).

(Continued)

*Primary Examiner* — Jason Lappas
(74) *Attorney, Agent, or Firm* — Brooks, Cameron & Huebsch, PLLC

(57) ABSTRACT

Apparatuses and methods for interconnections for 3D memory are provided. One example apparatus can include a stack of materials including a plurality of pairs of materials, each pair of materials including a conductive line formed over an insulation material. The stack of materials has a stair step structure formed at one edge extending in a first direction. Each stair step includes one of the pairs of materials. A first interconnection is coupled to the conductive line of a stair step, the first interconnection extending in a second direction substantially perpendicular to a first surface of the stair step.

20 Claims, 7 Drawing Sheets

(56) References Cited

U.S. PATENT DOCUMENTS

| | | | |
|---|---|---|---|
| 8,264,866 | B2 | 9/2012 | Fukumizu et al. |
| 8,284,601 | B2 | 10/2012 | Son et al. |
| 2003/0072172 | A1 | 4/2003 | Somasekhar et al. |
| 2007/0252201 | A1 | 11/2007 | Kito et al. |
| 2009/0268522 | A1* | 10/2009 | Maejima ............... G11C 5/02 365/185.11 |
| 2009/0310415 | A1* | 12/2009 | Jin ............... H01L 27/11519 365/185.17 |
| 2010/0258913 | A1 | 10/2010 | Lue |
| 2011/0084397 | A1 | 4/2011 | Lung |
| 2011/0244666 | A1 | 10/2011 | Kim et al. |
| 2011/0286283 | A1 | 11/2011 | Lung et al. |
| 2012/0007167 | A1 | 1/2012 | Hung et al. |
| 2012/0091413 | A1 | 4/2012 | Nguyen et al. |
| 2012/0119287 | A1 | 5/2012 | Park et al. |
| 2012/0306089 | A1 | 12/2012 | Freeman et al. |

OTHER PUBLICATIONS

Tanaka, et al., "Bit Cost Scalable Technology with punch and plug process for Ultra High Density Flash Memory," Jun. 2007, pp. 14-15, Toshiba Corporation.

Endoh, et al., "Novel Ultrahigh Density Flash Memory with a Stacked Surrounding Gate Transistor (S-SGT) Structured Cell," IEEE Transactions on Electron Devices, vol. 50, No. 4, pp. 945-951, Apr. 2003.

Fukusumi, et al., "Optimal Integration and Characteristics of Vertical Array Devices for Ultra High Density, Bit Cost Scalable Flash Memory," IEDM Technical Digest, pp. 449-452, Dec. 10-12, 2007.

Crowley, et al., "512 Mb PROM with 8 Layers of Antifuse/Diode Cells, " ISCC, 10 pages, Feb. 2003.

Johnson, et al., "512-Mb PRPM with a Three-Dimensional Array of DiodelAntifuse Memory Cells," IEEE Journal of Solid-State Circuits, vol. 38, No. 11, 9 pages, Nov. 2003.

Katsumata, et al., "Pipe-shaped BiCS Flash Memory with 16 Stacked Layers and Multi-Level-Cell Operation for Ultra High Density Storage Devices," Symposium on VLSI Technology Digest of Technical Papers, pp. 136-137, Jun. 2009.

Jang, et al., "Vertical Cell Array Using TCAT (Terabit Cell Array Transistor) Technology for Ultra High Density NAND Flash Memory," Symposium on VLSI Technology Digest of Technical Papers, pp. 192-193, Jun. 2009.

Kim, et al., "Novel Vertical-Stacked-Array-Transistor (VSAT) for Ultra-High-Density and Cost-effective NAND Flash Memory Devices and SSD (Solid State DRive)," Symposium on VLSI Technology Digest of Technical Papers, pp. 186-187, Jun. 2009.

Kim, et al., "Multi-Layered Vertical Gate NAND Flash Overcoming Stacking Limit for Terabit Density Storage," Symposium on VLSI Technology Digest of Technical Papers, pp. 188-189, Jun. 2009.

International Search Report and Written Opinion for related PCT Patent Application No. PCT/US2014/016791, mailed May 26, 2014, 14 pages.

Office Action for related Taiwan Patent Application No. 103105923, dated Nov. 30, 2015, 17 pages.

Notice of Rejection for related Korea Patent Application No. 10-2015-7024197, dated Mar. 30, 2016, 6 pages.

* cited by examiner

INTERCONNECTIONS FOR 3D MEMORY

PRIORITY INFORMATION

This application is a Divisional of U.S. application Ser. No. 13/774,522, filed Feb. 22, 2013, which issues as U.S. Pat. No. 9,111,591 on Aug. 18, 2015, the contents of which are included herein by reference.

TECHNICAL FIELD

The present disclosure relates generally to semiconductor memory apparatuses and methods of forming, and more particularly, to apparatuses and methods for interconnections of three-dimensional (3D) memory.

BACKGROUND

Memory devices are typically provided as internal, semiconductor, integrated circuits in computers or other electronic devices. There are many different types of memory, including random-access memory (RAM), read only memory (ROM), dynamic random access memory (DRAM), synchronous dynamic random access memory (SDRAM), resistive memory, e.g., RRAM, and Flash memory, among others.

Memory devices are utilized as volatile and non-volatile data storage for a wide range of electronic applications. Flash memory typically uses a one-transistor memory cell that allows for high memory densities, high reliability, and low power consumption. Non-volatile memory may be used in, for example, personal computers, portable memory sticks, solid state drives (SSDs), digital cameras, cellular telephones, portable music players such as MP3 players, movie players, and other electronic devices.

Memory devices can comprise memory arrays of memory cells, which can be arranged in various two or three dimensional configurations. Associated circuitry coupled to a memory array can be arranged in a substantially planar configuration, for instance, and can be coupled to memory cells via interconnections. Scaling in 3D NAND can be problematic due to capacitive coupling, among other issues.

DETAILED DESCRIPTION

Figure 1A:
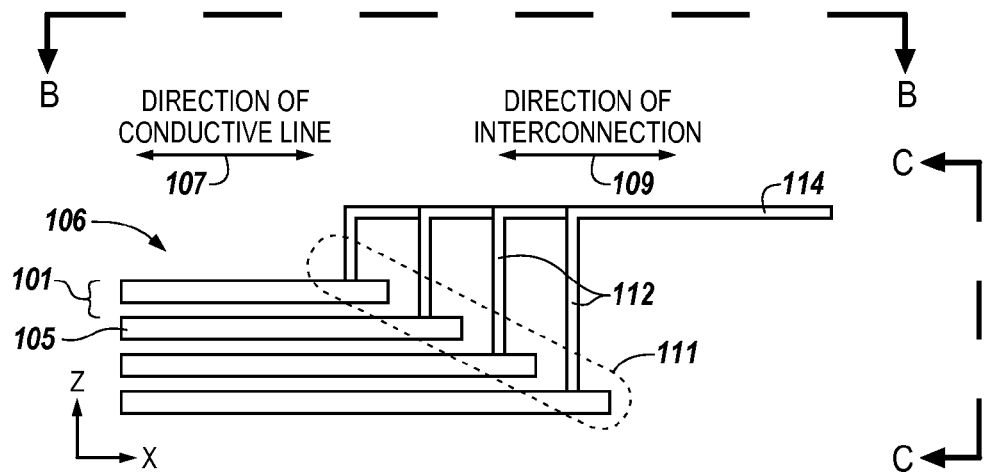
FIGS. 1A-C are block diagrams illustrating prior art interconnections from a 3D memory array.

Apparatuses and methods for interconnections for three dimensional (3D) memory are provided. One example apparatus can include a stack of materials including a plurality of pairs of materials, each pair of materials including a conductive line formed over an insulation material. The stack of materials has a stair step structure formed at one edge extending in a first direction. Each stair step includes one of the pairs of materials. A first interconnection is coupled to the conductive line of a stair step, the first interconnection extending in a second direction substantially perpendicular to a first surface of the stair step.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

The figures herein follow a numbering convention in which the first digit or digits correspond to the drawing figure number and the remaining digits identify an element or component in the drawing. Similar elements or components between different figures may be identified by the use of similar digits. As will be appreciated, elements shown in the various embodiments herein can be added, exchanged, and/or eliminated so as to provide a number of additional embodiments of the present disclosure. In addition, the proportion and the relative scale of the elements provided in the figures are intended to illustrate various embodiments of the present disclosure and are not to be used in a limiting sense.

As used herein, the term "substantially" intends that the characteristic needs not be absolute, but is close enough so as to achieve the advantages of the characteristic. For example, "substantially parallel" is not limited to absolute parallelism, and can include orientations that are intended to be parallel but due to manufacturing limitations may not be precisely parallel. For example, "substantially parallel" features are at least closer to a parallel orientation than a perpendicular orientation, and generally are formed within a few degrees of parallel. Similarly, "substantially perpendicular" is not limited to absolute perpendicularity, and can include orientations that are intended to be parallel but due to manufacturing limitations may not be precisely perpendicular. For example, "substantially perpendicular" features are at least closer to a perpendicular orientation than a parallel orientation, e.g., within a few degrees of perpendicular.

The terms "first," "second," "third," and "fourth" may be used herein, and/or in the claims, merely for convenience in differentiating the nomenclature of various features from one another. The use of such terms does not necessarily imply that the materials are of different composition, but sometimes are used to distinguish between materials formed at different elevations, at different times, or in different manners, even if of the same composition. The use of such terms does not intend to convey a particular ordering of the features, including, but not limited to, an order of forming.

3D NAND memory can use a stair step structure in order to make respective conductive lines in a stack of conductive lines each accessible to interconnections oriented perpendicular to the conductive lines. However, as the quantity of conductive lines in the stack of conductive lines increases, the transitions to interconnections can become more challenging because quantity of interconnections to be accomplished within a width of the conductive line stack also increases. Therefore, the scaling of 3D NAND memory can thereby be limited. Arranging conductive lines and/or interconnections in closer proximity to one another also increases capacitive coupling, which can also limit the scaling of 3D NAND memory. As such, scaling of 3D NAND memory can be improved by the apparatuses and methods for interconnections for 3D memory of the present disclosure.

Figure 1B:
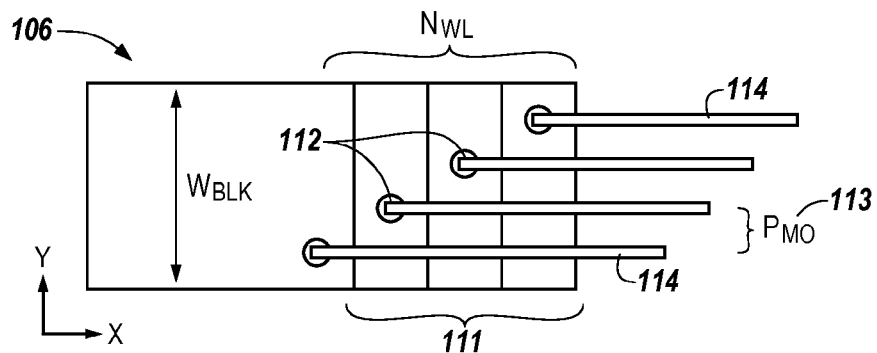
Figure 1C:
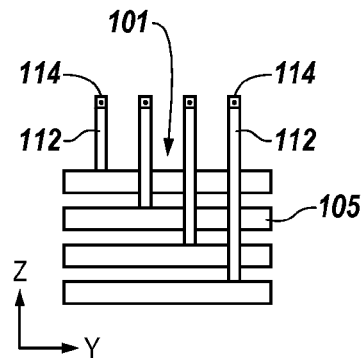

FIGS. 1A-C are block diagrams illustrating prior art interconnections from a 3D memory array. For example, FIG. 1A is a side view (in an X-Z plane), FIG. 1B is a top view (in an X-Y plane), and FIG. 1C is an end view (in a Y-Z plane) of a stack of materials 106. The view provided by FIG. 1B is shown by cutline BB in FIG. 1A, and the view provided by FIG. 1C is shown by cutline CC in FIG. 1A.

FIG. 1A shows a cross-sectional side view of the stack of materials 106. The stack of materials 106 includes a plurality of pairs of materials 101, each pair of materials 101 including a conductive line 105 formed over an insulation material. The insulation material is not explicitly shown in FIG. 1A, but is located beneath each conductive line 105, such as to be in the gap between conductive lines shown in FIG. 1A, for example. The stack of materials 106 has a stair step structure 111 formed at an edge. The direction 107 of the conductive lines 105 is shown in FIG. 1A corresponding to the direction of the longest dimension of a conductive line 105.

A vertical interconnection 112, e.g., a via, is coupled to the conductive line 105 of a stair step. The vertical interconnection 112 extends in direction substantially perpendicular to the top surface of the conductive line 105 of a stair step. In this example, the top surface of 105 is in an X-Y plane, and the vertical interconnection 112 is in the Z direction. An interconnection 114 is coupled to the vertical interconnection 112. Interconnection 114 can be a conductive material such as a metal for instance. The direction 109 of interconnection 114 is the direction corresponding to the longest dimension of interconnection 114. As shown in FIG. 1A, the direction 109 of the interconnection 114 is in the same direction as the direction 107 of the conductive lines 105, e.g., the X direction, in this example. Interconnection 114 is oriented in a plane parallel to the plane in which a conductive line 105 is oriented, e.g., the Y-Y plane, in this example.

FIG. 1B shows a top view of the stack of materials 106. A width of the stack of materials 106 is indicated in FIG. 1B as $W_{BLK}$. The stair step structure 111 includes a number of stair steps, indicated in FIG. 1B as $N_{WL}$. The stair step structure 111 shown in FIG. 1A-C includes 4 stair steps. The pitch between interconnections 114 is indicated in FIG. 1B as $P_{MO}$, is limited to be less than $W_{BLK}/N_{WL}$, for example. As the quantity of conductive lines 105 increases, $N_{WL}$ increases, which causes $P_{MO}$ to decrease for a given, e.g., constant, $W_{BLK}$. FIG. 1C is a cross-sectional end view of the stack of materials 106.

Figure 2:
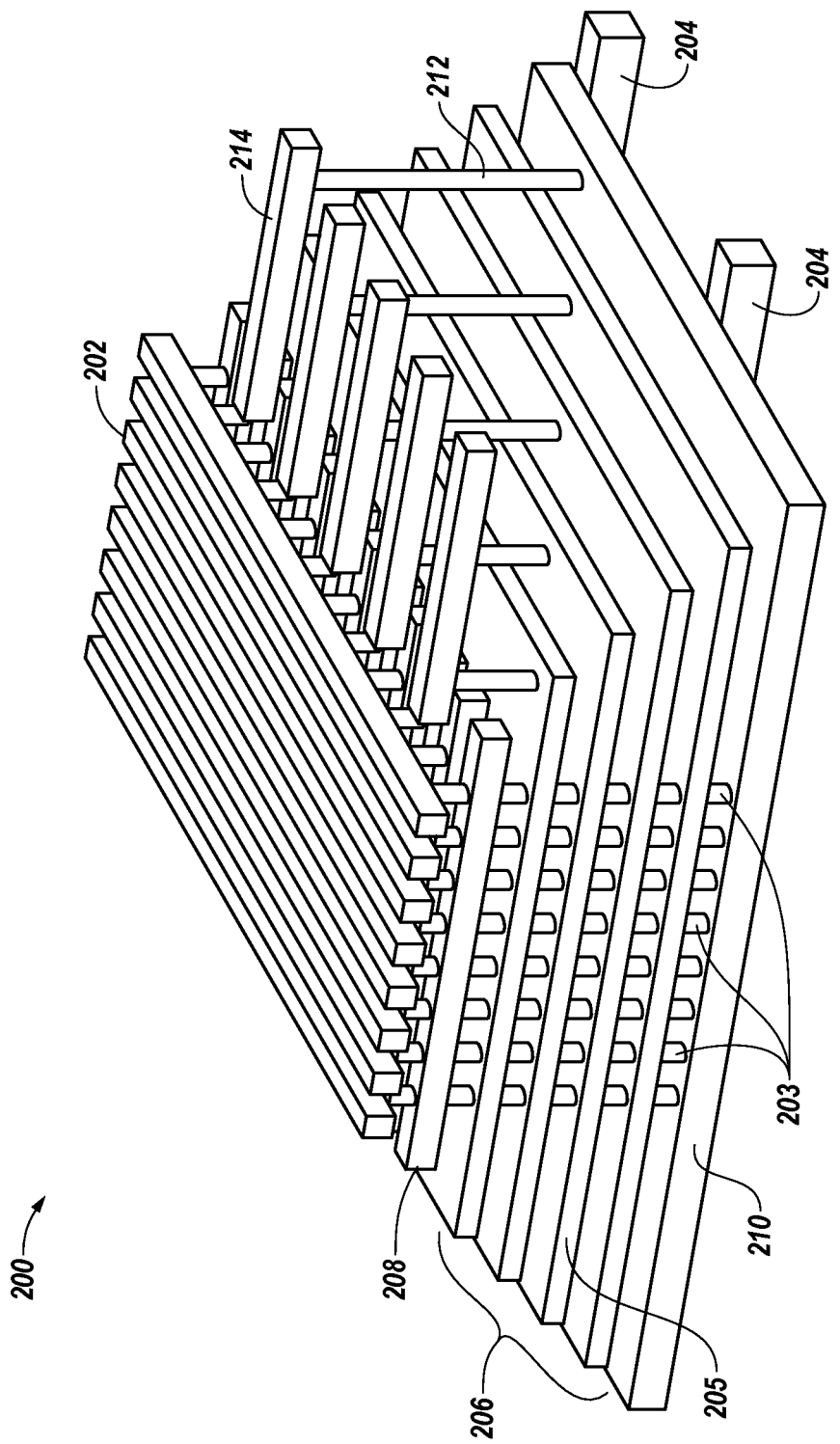
FIG. 2 is a perspective view of a portion of a prior art 3D memory array.

FIG. 2 is a perspective view of a portion of a prior art 3D memory array 200. The memory array 200 can comprise, for example, a NAND flash memory array. Memory array 200 includes a number of vertical strings of series-coupled memory cells 203 oriented orthogonal to a number of conductive lines, such as access lines 205 and/or data lines 202. As used herein, A "coupled to" B refers to A and B being operatively coupled together, such as where A and B are electrically connected with each other, such as through a direct ohmic connection or through an indirect connection.

The 3D memory array 200 can include a stack of materials 206 having a plurality of pairs of materials, each pair including a conductive line 205 formed over an insulation material. Insulating materials between various conductive lines are omitted from FIG. 2 for clarity.

Additionally, the 3D memory array 200 can include first select gate line 208 (coupled to first select gates) and second select gate line 210 (coupled to second select gates) on either end of the vertical strings of series-coupled memory cells 203. A first select gate line 208, such as a drain select gate (SGD) line, can be arranged at a first end of a number of the vertical strings of series-coupled memory cells 203, and a second select gate line 210, such as a source select gate (SGS) line, can be arranged at a second end, e.g., opposite end, of the vertical strings of series-coupled memory cells 203. The 3D memory array 200 can also include one or more source lines 204.

The stack of materials 206, and optionally select gate lines 208/210, can have a stair step structure 111 formed at their edge. A vertical interconnection 212, e.g., a via, is coupled to the conductive line 205 or select gate lines 208/210 of a stair step. The vertical interconnection 212 extends in direction substantially perpendicular to the top surface of the stair step. An interconnection 214 is coupled to the vertical interconnection 212. Interconnection 214 can extend further than shown in FIG. 2.

Figure 3A:
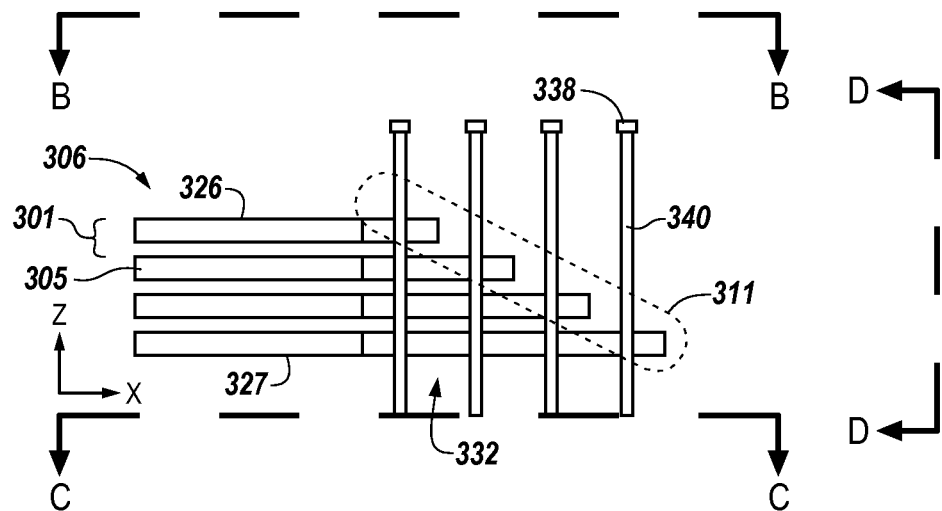
FIGS. 3A-D are block diagrams illustrating interconnections from a 3D memory array in accordance with a number of embodiments of the present disclosure.
Figure 3B:
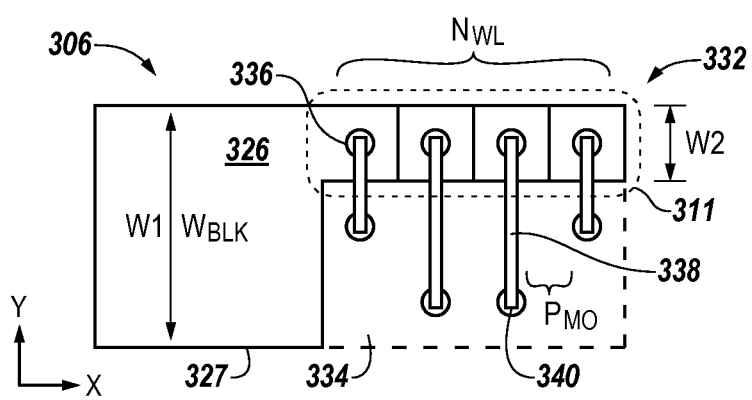
Figure 3C:
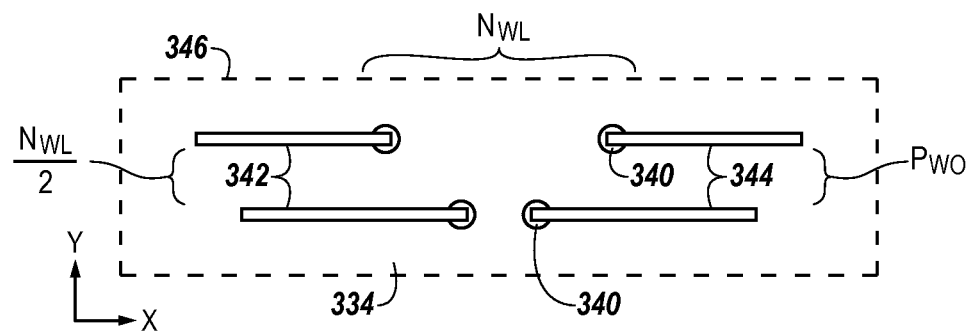
Figure 3D:
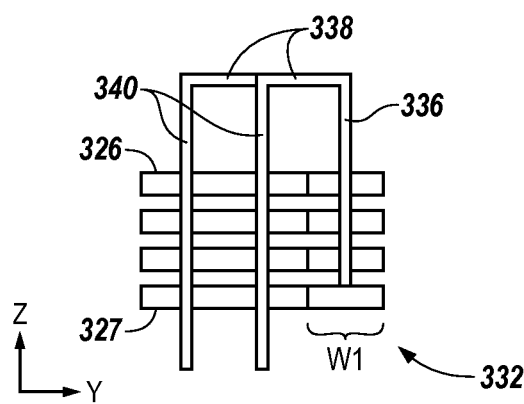

FIGS. 3A-D are block diagrams illustrating interconnections from a 3D memory array in accordance with a number of embodiments of the present disclosure. For example, FIG. 3A is a side view (in an X-Z plane), FIG. 3B is a top view (in an X-Y plane), and FIG. 1D is an end view (in a Y-Z plane) of a stack of materials 306. FIG. 3C is a top view (in an X-Y plane) below the stack of materials 306. The view provided by FIG. 3B is shown by cutline BB in FIG. 3A, the view provided by FIG. 3C is shown by cutline CC in FIG. 3A, and the view provided by FIG. 3D is shown by cutline DD in FIG. 3A.

FIG. 3A shows a cross-sectional side view of the stack of materials 306. The stack of materials 306 can include a plurality of pairs of materials 301, each pair of materials 301 including a conductive line 305 formed over an insulation material. The insulation material is not explicitly shown in FIG. 3A, but can be located beneath each conductive line 305, such as to be in the gap between conductive lines shown in FIG. 3A, for example. Conductive lines 305 can be formed to have a wide width portion 327 and a narrow width portion 332, as shown and discussed further with respect to FIG. 3B.

The stack of materials 306 can have a stair step structure 311 formed on at least one edge. Each stair step includes one of the pairs of materials arranged such that the conductive line 305 thereof is accessible to an interconnection. The direction of the conductive lines 305 shown in FIG. 3A is the same as the direction 107 indicated for the conductive lines 105 shown in FIG. 1A, e.g., X direction.

Ascending, e.g., vertical, interconnections 336, e.g., a vias, can be coupled to the conductive line 305 of respective stair steps. The ascending interconnection 336 can extend in direction substantially perpendicular to a top surface 326 of the conductive line 305 of a stair step. The ascending interconnections 336 are not visible in FIG. 3A because they are located behind the corresponding descending interconnections 340 (discussed later).

A top planar interconnection 338 can be coupled to the ascending interconnection 336. Top planar interconnection 338 need not be routed over the top of memory array 306. The term "top" as used here is intended only to distinguish between interconnections routed in a plane parallel to a plane in a conductive line 305 is formed, e.g., distinguish interconnections in a parallel plane located above the conductive lines 305 from interconnections in a parallel plane located below the conductive lines 305.

The top planar interconnections 338 can be formed in a plane, e.g., X-T plane, substantially parallel to the plane within which the conductive lines 305 are formed. However, the top planar interconnections 338 can be formed, for example, in a direction perpendicular to each of the conductive lines 305 and the ascending interconnections 336, where direction is along the longest dimension of the respective conductive lines 305, ascending interconnections 336, and top planar interconnections 338. For example, top planar interconnections 338 have a direction into/out of the page in FIG. 3A, e.g., Y direction, which is perpendicular to the conductive lines 305, e.g., extending in an X direction, and is perpendicular to the ascending interconnections 336, e.g., extending in a Z direction. According to various examples, top planar interconnections 338 are formed to be in a direction that is different than the direction of the conductive lines 305.

Descending interconnections 340 can be coupled to the top planar interconnection 338, as shown in FIG. 3A. The descending interconnections 340 can extend to below the bottom pair of materials 301 in the stack of materials 306. According to a number of embodiments, the descending interconnections 340 can extend in a same direction as the ascending interconnections 336, e.g., extending in a Z direction.

The descending interconnections 340 can extend further below the stack of materials 306 than is shown in FIG. 3A. Conductive materials, ascending interconnections 336, top planar interconnections 338, and/or descending interconnections 340 can be formed of metal or polysilicon, for example, or other doped or undoped materials. Insulating materials can be formed of oxide, for example, and/or other dielectric materials.

FIG. 3B shows a top view of the stack of materials 306. As mentioned above, conductive lines 305 can be formed to have a wide width portion 327 as indicated by width W1, and a narrow width portion 332 as indicated by width W2, where W1>W2. The width of the stack of materials 306 is indicated in FIG. 3B as $W_{BLK}$, which can be the same width as W1. Although FIG. 3B shows the narrow width portion 332 formed at one side, e.g., along a same edge, of the wide width portion 327, embodiments of the present disclosure are not limited to such configurations, and the narrow width portion 332 can be formed at other locations along the width, $W_{BLK}$, of the stack of materials 306.

The stair step structure 311 can be formed on at least one edge of the narrow width portion 332, and the ascending interconnection 336 can be coupled to conductive line 305 at top surfaces of steps of the stair step structure 311 within the narrow width portion 332. Stair step structure 311 can include a number of stair steps formed in the narrow width portion 332, as indicated in FIG. 3B as $N_{WL}$. The stair step structure 311 shown in FIGS. 3A, B, and D includes 4 stair steps. However, embodiments of the present disclosure are not limited to a particular quantity of stair steps. Additional steps can be accommodated by extending the stair step structure further out away from the wide width portion 327 of the conductive lines 305.

The pitch between top planar interconnections 338 is indicated in FIG. 3B as $P_{MO}$. However, unlike the prior art structure shown in FIG. 1B, and because a greater number of stair steps can be accommodated in the stair step structure 311 by extending the narrow width portion 332 further out away from the wide width portion 327 of the conductive lines 305, e.g., in an X direction, the pitch between top planar interconnections 338 is not constrained by $W_{BLK}$ or $N_{WL}$ for embodiments of the present disclosure.

According to a number of embodiments, descending interconnections 340 can be the located within an area 334. Area 334 can be adjacent to each of wide width portion 327 and the narrow width portion 332. Area 334 can have a width equal to W1-W2, and can have a length equal to the distance by which the narrow width portion 332 extends from the wide width portion 327. For example, area 334 can occupy a footprint left where a portion of the stack of materials 306 was removed to form the narrow width portion 332, for example. According to some embodiments, the descending interconnections can be offset from one another so as to maintain a minimum pitch therebetween in a number of directions, e.g., 2 directions.

FIG. 3C is a cross-sectional top view of an elevation below the stack of materials 306. Bottom planar interconnections 342 and 344 can be coupled to respective descending interconnections 340. Bottom planar interconnections 342 can extend from descending interconnections 340 in one direction, e.g., in an negative X direction, and bottom planar interconnections 344 can extend from descending interconnections 340 in another, e.g., different, direction, e.g., in an positive X direction. According to a number of embodiments, bottom planar interconnections 342 and 344 extend perpendicularly to each of descending interconnections 340 and top planar interconnections 338. According to a number of embodiments, bottom planar interconnections 342 and 344 extend along a same direction as the conductive lines 305, e.g., along an X direction.

For example, bottom planar interconnections 344 can extend from descending interconnections 340 in a direction, e.g., a positive X direction, opposite from the direction, e.g., a negative X direction, by which bottom planar interconnections 342 extend from descending interconnections 340, as shown in FIG. 3C. Bottom planar interconnections 342 and 344 can extend from descending interconnections 340 so as to be parallel to the conductive lines 305. However, the locations and/or directions to which bottom planar interconnections 342 and 344 extend are not limited to those shown in FIG. 3C. That is, bottom planar interconnections 342 and 344 can individually extend in various radial directions from descending interconnections 340, e.g., in an X-Y plane, and/or can include additional elevation and/or route changes.

As shown in FIG. 3C, the bottom planar interconnections 342 and 344 can extend in different, e.g., opposite, directions, e.g., in an X-Y plane. In this manner, the pitch, $P_{WO}$, can be relaxed by half, e.g., $N_{WL}/2$. For example, a portion, e.g., half, of a string driver, e.g., line driver, can be placed in one direction and another portion, e.g., half, placed in a different direction with the two directions corresponding to the directions in which bottom planar interconnections 342 and 344 are respectively routed.

FIG. 3D is a cross-sectional end view of the stack of materials 306, and shows ascending interconnections 336 extending, e.g., in a Z direction, from the conductive line 305 of a stair step in direction substantially perpendicular to a plane, e.g., an X-Y plane, of the conductive line 305. For example, ascending interconnections 336 can extend from a conductive line 305 located at a top surface of a stair step. FIG. 3D further shows top planar interconnections 338 coupled between ascending interconnections 336 and descending interconnections 340, with descending interconnections 340 located within the width of the stack of materials 306. FIG. 3D also shows descending interconnections 340 extending down below the stack of materials 306. Bottom planar interconnections 342 and 344 are not shown in FIG. 3D.

Figure 4:
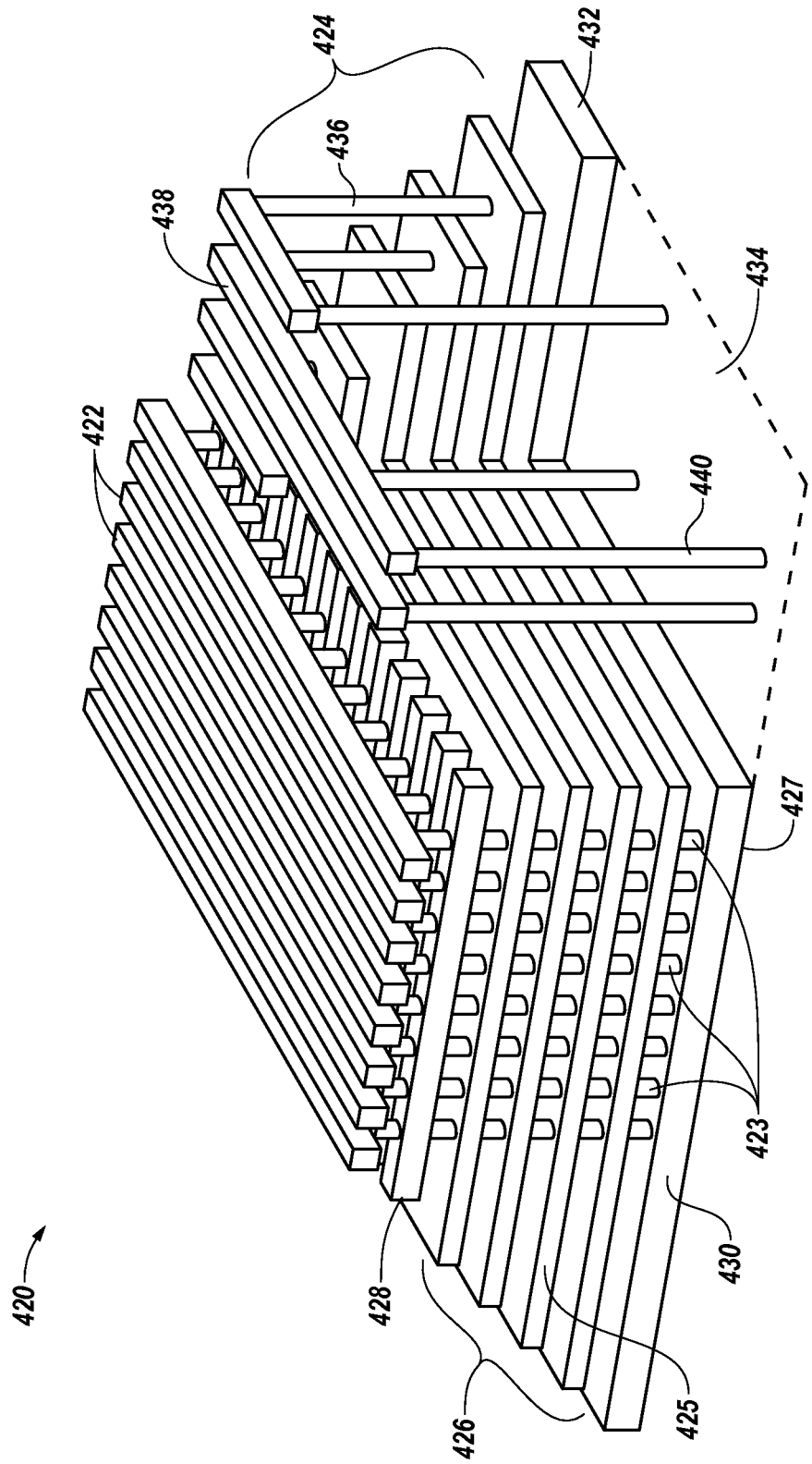
FIG. 4 is a perspective view of a portion of a 3D memory array having interconnections in accordance with a number of embodiments of the present disclosure.

FIG. 4 is a perspective view of a portion of a 3D memory array 420 having interconnections in accordance with a number of embodiments of the present disclosure. The memory array 420 can comprise, for example, a 3D NAND flash memory array. Memory array 420 includes a number of vertical strings of series-coupled memory cells 203 oriented orthogonal to a number of conductive lines, such as access lines 425 and/or data lines 422. The 3D memory array 420 can include a stack of materials 426 having a plurality of pairs of materials, each pair including a conductive line 425 formed over an insulation material. Insulating materials between various conductive lines are omitted from FIG. 4 for clarity.

Additionally, the 3D memory array 420 can include first select gate line 428 (coupled to first select gates) and second select gate line 430 (coupled to second select gates) on either end of the vertical strings of series-coupled memory cells 423. A first select gate line 428, such as a drain select gate (SGD) line, can be arranged at a first end of a number of the vertical strings of series-coupled memory cells 423, and a second select gate line 430, such as a source select gate (SGS) line, can be arranged at a second end, e.g., opposite end, of the vertical strings of series-coupled memory cells 423.

The stack of materials 426 can have a stair step structure 424 formed at their edge. The stair step structure 424 can be formed to also include other conductive materials, such as the first select gate line 428, second select gate line 430, and/or other conductive structures. The quantity and arrangement of the various components forming the stair step structure are not limited to that shown in FIG. 4.

A plurality of data lines 422, e.g., bit lines, can be oriented in a first plane, e.g., in an X-Y plane, extending in a first direction, e.g., in a Y direction. The vertical strings of series-coupled memory cells 423 can be oriented orthogonal to the first plane, e.g., in a Z direction. The plurality of access lines 425, e.g., word lines, can be oriented in second direction, e.g., in an X direction, in planes oriented substantially parallel to the first plane, e.g., in X-Y planes. The plurality of access lines 425 can be oriented perpendicular to the plurality of data lines 422, for example. The data lines 422 can be shared by a number of vertical strings of series-coupled memory cells 423 in the first direction, and the access lines 425 can be shared by a number of vertical strings of series-coupled memory cells 423 in the second direction. The 3D memory array 420 can include a number of source lines 204 (not shown in FIG. 4).

The select gate lines 428 and 430 can operate to select a particular vertical string of series-coupled memory cells 423 between a data line 422 and a source line. As such, the vertical strings of series-coupled memory devices 423 can be located at the intersections of the data lines 422 and source lines.

The access lines 425 can be coupled to (and in some cases from) control gates of memory cells at a particular level and can be used to select a particular one of the series-coupled memory cells 423 within a vertical string. In this manner, a particular memory cell 423 can be selected and electrically coupled to a data line 422 via operation of the first select gate line 428, second select gate line 430, and an access line 425. The access lines 425 can be configured to select a memory cell 423 at a particular location within one or more of the vertical strings of series-coupled memory cells 423.

As shown in FIG. 4, stack of materials 426 can be formed to have a wide width portion 427 and a narrow width portion 432. The narrow width portion 432 can be formed by removing a portion of the stack of materials 426 initially formed in area 434. The portion of the stack of materials 426 initially formed in area 434 can be removed before, or after, stair step structure 424 formation. That is, the stack of materials may be initially formed including the portion within area 434, and a stair step structure may be formed along at least a portion of an edge of the stack of materials greater than the narrow width portion 432. For example, a stair step structure may be initially formed across the entire width, $W_{BLK}$, of the stack of materials, with the portion of the stack of materials initially formed in area 434 removed (including a portion of the stair step structure formed therein). Alternatively, the narrow width portion 432 can be formed by not forming the portion of the stack of materials 426 in area 434, or by some other process(es).

The planar access lines 425, and optionally select gate lines, e.g., 428 and/or 430, and other materials, can be configured to form a 3D stair step structure 424 at an edge of the narrow width portion 432 to facilitate vertically-oriented coupling thereto, such as by ascending, e.g., vertical, conductors 436. That is, respective planar access lines 425 can be formed as respective stair steps of the stair step structure 424. A stair step structure 424, as used herein, means a 3D structure having a plurality of stair steps at different elevations extending to different distances in a lateral direction, such as is generally associated with a set of stair steps.

According to a number of embodiments of the present disclosure, the steps of lower elevations can extend laterally beyond the lateral distance that the step at an immediately higher elevation extends, as shown in FIG. 4. That is, lower steps extend further in a lateral direction than step(s) above. Embodiments of the present disclosure can include a stack of materials 426 having one or more edges having a stair step configuration. Embodiments of the present disclosure can include only a portion, e.g., less than all, of an edge of a stack formed into a stair step configuration. For example, embodiments of the present disclosure can include that a first portion of one edge of a stack of materials can be formed to have a stair step configuration and a second portion of the one edge can be formed so as not to have a stair step configuration.

A lower step can extend laterally a sufficient distance beyond a next higher step so that a vertical coupling can be made to the portion of the lower step extending laterally past the next higher step. In this manner, an ascending conductor 436 can be coupled to a particular step.

FIG. 4 shows top planar interconnections 438 coupled to respective ones of the ascending interconnection 436. The top planar interconnections 438 can be formed in a plane, e.g., an X-Y plane, substantially parallel to the plane within which the conductive lines 425 are formed. However, the top planar interconnections 438 can be formed to extend in a direction, e.g., a Y direction, perpendicular to each of the conductive lines 425, e.g., extending in an X direction, and the ascending interconnections 436, e.g., extending in a Z direction, where direction is defined by the longest dimension of the respective conductor. According to a number of embodiments, top planar interconnections 438 can be formed in a direction parallel to data lines 422, e.g., a Y direction, at a same or different elevation.

Descending interconnections 440 can be coupled to the top planar interconnection 438, as shown in FIG. 4. According to a number of embodiments, descending interconnections 440 can be located with area 434, and conversely, not located outside area 434. The descending interconnections 440 can extend to below the stack of materials 426 and/or second select gate line 430, and/or source line(s). The descending interconnections 340 can extend further below the stack of materials 306 than is shown in FIG. 4. According to a number of embodiments of the present disclosure, ascending interconnections 436, top planar interconnections 438, and descending interconnections 440 can all be formed of polysilicon, for example, or other doped or undoped materials. Bottom planar interconnection are not shown in FIG. 4 for clarity.

The memory array 420 can be coupled to various circuitry associated with operating the memory array 420. Such circuitry can include a string driver, for instance. The circuitry associated with operating the memory array 420 can be CMOS circuitry formed near the substrate underneath the memory array 420 and/or below the elevation of the memory array 420 if not directly underneath the memory array 420.

As an example, bottom planar interconnections can be routed from the memory array 420, for example, to a string driver. An electrical coupling can be made between the stack of materials, including conductive lines 425, select gate lines 428/430, and/or source lines, and the string driver, e.g., via the bottom planar interconnections.

Benefits of a number of embodiments of the present disclosure include that a stack of conductive materials can include more pairs of conducting and insulating materials than can be accommodated for a given pitch design rule in an arrangement where the ascending interconnections 436 are confined to the width, $W_{BLK}$, of the stack of conductive materials, which is constrained by the quantity $W_{BLK}/N_{WL}$.

Figure 5:
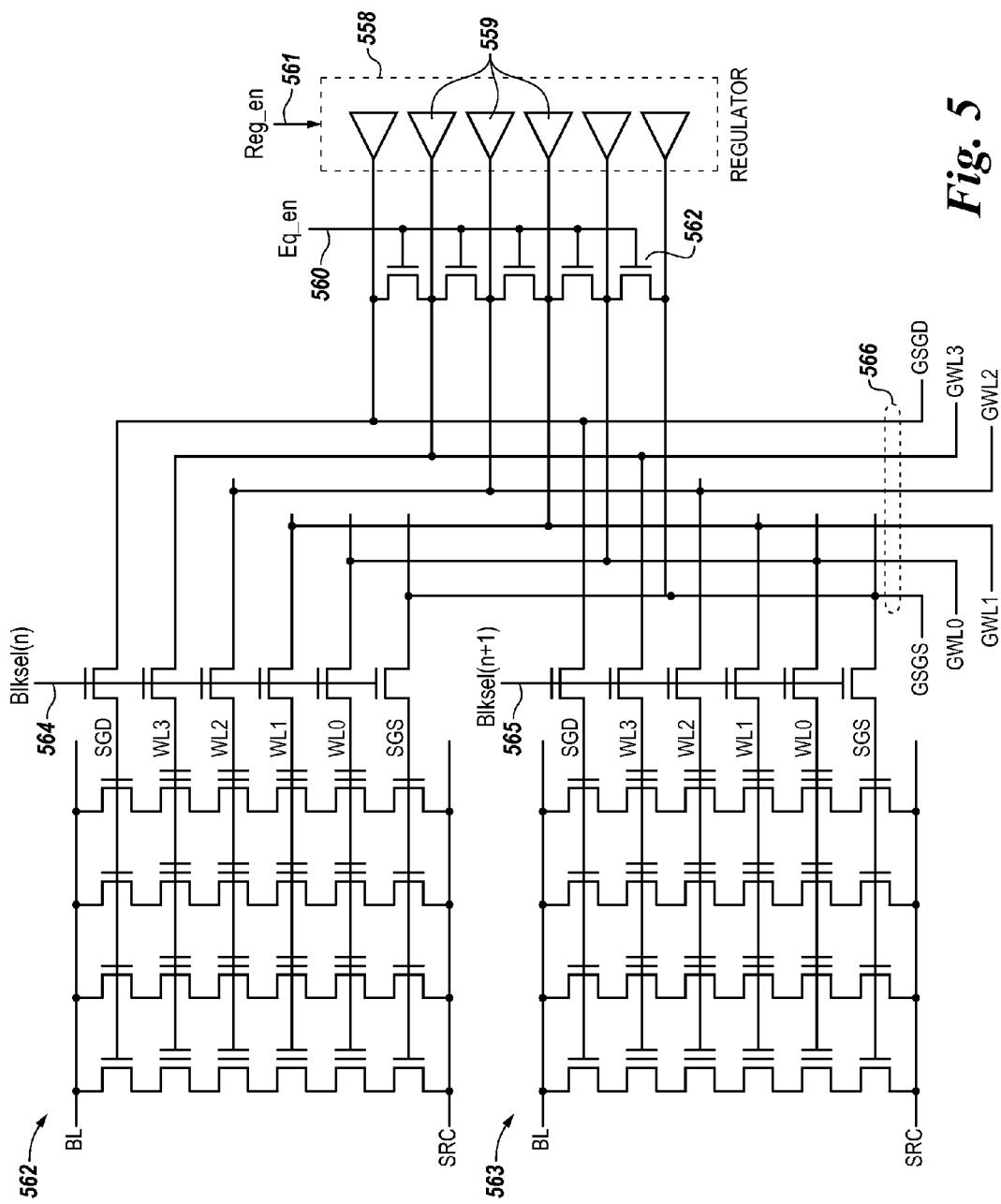
FIG. 5 is a schematic diagram illustrating interconnections for 3D memory arrays in accordance with a number of embodiments of the present disclosure.

FIG. 5 is a schematic diagram illustrating interconnections for 3D memory arrays in accordance with a number of embodiments of the present disclosure. FIG. 5 shows first 562 and second 563 memory arrays. Each of first 562 and second 563 memory arrays include a number of vertical strings of series-coupled memory cells between a data line (BL) and source line (SRC). The vertical strings of series-coupled memory cells are controlled by a number of access lines, e.g., WL0, WL1, WL2, WL3, a drain select gate (SGD), and source select gate (SGS).

FIG. 5 illustrates coupling between the first 562 and second 563 memory arrays and global control lines 566, e.g., GSGS, GWL0, GWL1, GWL2, GWL3, and GSGD. The particular one of first 562 and second 563 memory arrays coupled to the global control lines 566 is determined by operation of selection transistors controlled by block select control lines, e.g., Blksel(n) 564 can be asserted to couple first 562 memory array to the global control lines 566, and Blksel(n+1) 565 can be asserted to couple second 563 memory array to the global control lines 566. Each memory array has local control lines, e.g., access lines, select gate lines, selectively coupleable to global control lines 566.

The selection transistors can be located under the memory array, e.g., 562 and/or 563, such as beneath but within a footprint of the memory array, or can be located at some elevation, e.g., below, but outside of a footprint of the memory array, or a combination of both, e.g., some selection transistors can be located under the memory array within a footprint of the memory array and other selection transistors can be located outside of a footprint of the memory array at a same or different elevation. The local control lines, e.g., access lines, select gate lines, can be formed for a 3D memory array, for example, as was described with respect to FIGS. 3A and 3B using a stair step structure to expose the local control lines, which can be coupled to ascending interconnections, and optionally top planar interconnections and descending interconnections, to be appropriately routed to selection transistors, as such routing was previously described. The global control lines 566 can be routed under the memory array, or over the memory array, e.g., 562, 563, or a combination of both, e.g., some global control lines 566 can be routed under the memory array and some global control lines 566 can be routed over the memory array.

Table 1 provides example operating parameters, e.g., voltages, for reading, programming, and erasing based on WL1 being selected for reading and programming, and first 562 memory array being selected with Blksel(n) high and second 563 memory array being deselected with Blksel(n+1) low:

TABLE 1

| Signal | Read | Program | Erase |
|---|---|---|---|
| Blksel(n) | 6 V | 22 V | 6 V |
| Blksel(n + 1) | 0 V | 0 V | 0 V |
| BL(n) | 1 V | 2 V("1")/0 V("0") | float |
| BL(n + 1) | 0 V | 2 V | float |
| SL | 0 V | 0 V | float |
| GSGS | 4 V | 0 V | float |
| GWL0, 2, 3 | 4 V | 8 V | 0 V |
| GWL1 | 0 V | 18 V | 0 V |
| GSGD | 4 V | 2 V | float |
| SGS(n) | 4 V | 0 V | float |
| WL0, 2, 3(n) | 4 V | 8 V | 0 V |
| WL1 | 0 V | 18 V | 0 V |
| SGD(n) | 4 V | 2 V | float |
| SGS(n + 1) | 0 V | 0 V | float |
| WL0-3(n + 1) | float | float | float |
| SGD(n + 1) | 0 V | 0 V | float |

According to a number of embodiments of the present disclosure, string drivers 559 of a regulator 558 are coupled to the respective global control lines 566. The string drivers 559 of a regulator 558 are controlled by a regulator enable (Reg_en) signal 561. Equalizing transistors 562 are located between pairs of global control lines 566 such that when the equalizing transistors 562 are operated they provide a conductive path between pairs of global control lines 566. The equalizing transistors 562 are controlled by an equalizing enable (Eq_en) signal 560.

According to a number of embodiments, after a program and/or read operation is completed, the string drivers 559 of a regulator 558 are disabled, such as by the regulator enable signal 561 going low. The global access lines and select gates, e.g., GWLs, GSGS, and GSGD, are left floating. The equalizing transistors 562 are operated so as to conduct, such as by equalizing enable signal 560 going high.

Although there can be large voltage differences between global control lines 566 during program and read operations, after equalization, the global control lines 566, and the local control lines coupled to the global control lines 566, can have substantially equal potential.

Subsequent to the above-described equalization, the global control lines 566, and the local control lines coupled to the global control lines 566, can be discharged to a reference potential, e.g., ground. Although there can be capacitance between conductive lines in the memory array because of the 3D configuration of the memory array, after equalization and discharge to the reference potential, the global control lines 566, and the local control lines coupled to the global control lines 566, do not have a negative potential.

According to an alternative embodiment, instead of, or in addition to, discharging the global control lines 566, and the local control lines coupled to the global control lines 566, to a reference potential, each of the global control lines 566, and the local control lines coupled to the global control lines 566, can be individually controlled, e.g., by a corresponding string driver 559, to bias to another potential other than the reference potential, e.g., ground, in preparation for a next operation.

Figure 6:
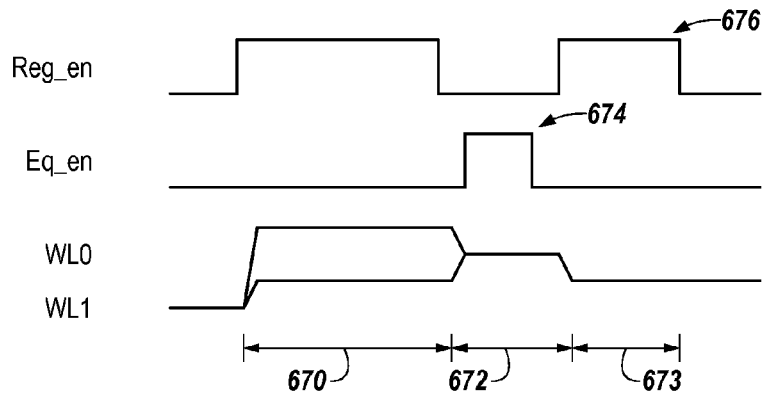
FIG. 6 is a timing diagram illustrating operating signals associated with interconnections of a 3D memory device operated in accordance with a number of embodiments of the present disclosure.

FIG. 6 is a timing diagram illustrating operating signals associated with interconnections of a 3D memory device operated in accordance with a number of embodiments of the present disclosure. The operating signals shown in FIG. 6 are based on WL0 being selected in case of a program operation and deselected in case of a read operation, and WL1 being deselected in case of a program operation and selected in case of a read operation. Time period 670 corresponds to the time during which a respective read or program operation occurs, time period 672 corresponds to the time period during which an equalization operation occurs, and time period 673 corresponds to the time period during which a discharge operation occurs.

During time period 670, the regulator enable (Reg_en) signal 676 is high, enabling string drivers, e.g., 559 in FIG. 5, to drive voltages of particular access line, e.g., WL0 voltage signal is shown high for an example program operation and WL1 voltage signal is shown high for an example read operation. The equalization circuits, e.g., equalizing transistors 562 in FIG. 5, are disabled during program and read operations as shown by the equalizing enable (Eq_en) signal being low, such that equalizing transistors 562 in FIG. 5 are not conducting.

During time period 670, e.g., after program or read operations, the Reg_en signal 676 goes low thereby disabling string drivers, e.g., 559 in FIG. 5, and the Eq_en signal goes high, such that equalizing transistors 562 in FIG. 5 are conducting, e.g., to couple WL0 and WL1 together. As a result, the voltage on each of WL0 and WL1 is driven to a same, e.g., equalized, voltage as shown in FIG. 6.

Subsequent to equalizing, the Eq_en signal goes low, thereby causing equalizing transistors 562 in FIG. 5 to not be conducting, e.g., isolating WL0 from WL1. During time period 673, Reg_en signal 676 goes high, enabling string drivers, e.g., 559 in FIG. 5, which can be used to drive voltages of a number of access lines, e.g., WL0 and WL1, to a voltage different than the equalized voltage, as is shown in FIG. 6.

Figure 7:
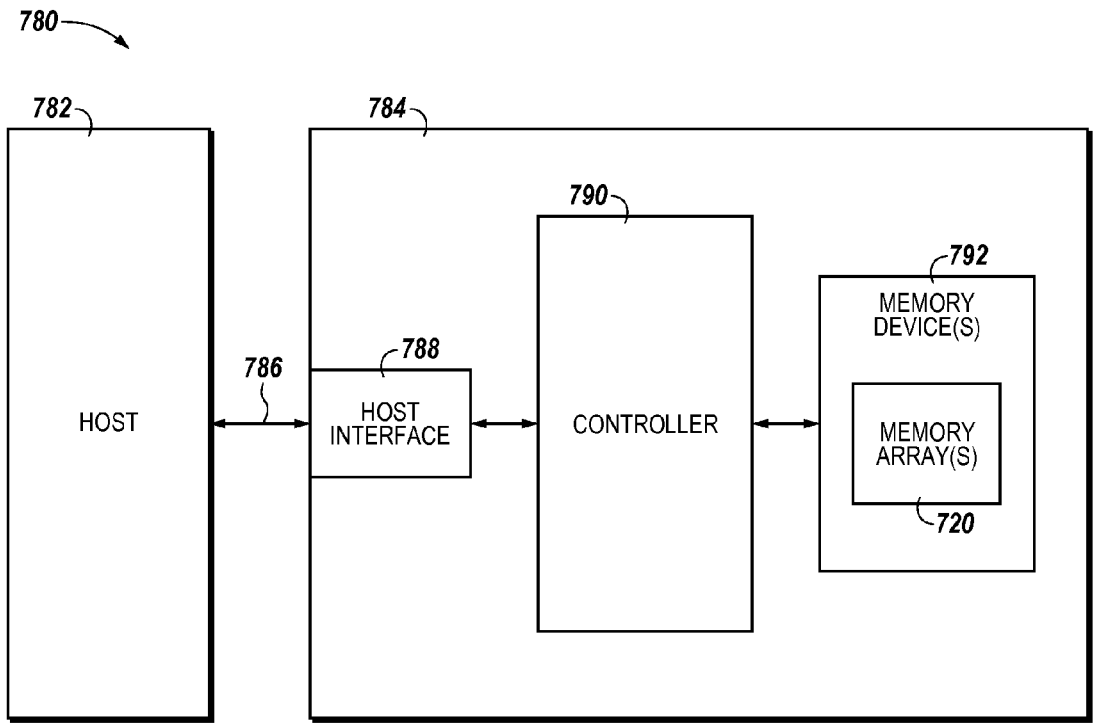
FIG. 7 is a block diagram of an apparatus in the form of a computing system including at least one 3D memory array in accordance a number of embodiments of the present disclosure.

FIG. 7 is a block diagram of an apparatus in the form of a computing system 780 including at least one 3D memory array 720 in accordance a number of embodiments of the present disclosure. As used herein, a memory system 784, a controller 790, a memory device 792, or a memory array 720 might also be separately considered an "apparatus." The memory system 784 can be a solid state drive (SSD), for instance, and can include a host interface 788, a controller 790, e.g., a processor and/or other control circuitry, and a number of memory devices 792, e.g., solid state memory devices such as NAND flash devices, which provide a storage volume for the memory system 784. A memory device 792 can comprise a number of memory arrays 720, such as memory array 420 shown in FIG. 4, or memory arrays 562/563 shown in FIG. 5.

In a number of embodiments, the controller 790, the number of memory devices 792, and/or the host interface 788 can be physically located on a single die or within a single package, e.g., a managed NAND application.

The controller 790 can be coupled to the host interface 788 and to the number of memory devices 792 via one or more channels and can be used to transfer data between the memory system 784 and a host 782. The interface 788 can be in the form of a standardized interface. For example, when the memory system 784 is used for data storage in a computing system 780, the interface 788 can be a serial advanced technology attachment (SATA), peripheral component interconnect express (PCIe), or a universal serial bus (USB), among other connectors and interfaces. In general, however, interface 788 can provide an interface for passing control, address, data, and other signals between the memory system 784 and a host 782 having compatible receptors for the host interface 788.

Host 782 can be a host system such as a personal laptop computer, a desktop computer, a digital camera, a mobile telephone, or a memory card reader, among various other types of hosts. Host 782 can include a system motherboard and/or backplane and can include a number of memory access devices, e.g., a number of processors. Host 782 can be coupled to the host interface 788 by a communication channel 786.

The controller 790 can communicate with the number of memory devices 792 to control data read, write, and erase operations, among other operations, including equalization, discharge, and string driver operations. The controller 790 can include, for example, a number of components in the form of hardware and/or firmware, e.g., one or more integrated circuits, and/or software for controlling access to the number of memory devices 792 and/or for facilitating data transfer between the host 782 and the number of memory devices 792.

The number of memory devices 792 can include a number of arrays of memory cells, e.g., arrays, such as those shown in FIGS. 4 and 5. The arrays can be flash arrays with a NAND architecture, for example. However, embodiments are not limited to a particular type of memory array or array architecture. The memory cells can be grouped, for instance, into a number of blocks including a number of physical pages. A number of blocks can be included in a plane of memory cells and an array can include a number of planes.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
   a memory array having a stack of conductive lines with a wide width portion and a narrow width portion, the narrow width portion having a stair step structure; and
   a controller coupled to the memory array, the controller configured to control:
      performing a number of operations; and
      equalizing potential of access lines for a block of the memory array after the number of operations is completed,
   wherein the stack of conductive lines is coupled to circuitry below the memory array through top planar interconnections coupled between ascending interconnections and descending interconnections, the top planar interconnections have a longest dimension in a direction different from a direction of a longest dimension of the conductive lines.

2. The apparatus of claim 1, wherein the conductive lines, the ascending interconnections, the descending interconnections, and the top planar interconnections are all formed of a same conductive material.

3. The apparatus of claim 1, wherein the stack of conductive lines are coupled to circuitry below the memory array through bottom planar interconnections located below the memory array coupled to the descending interconnections.

4. The apparatus of claim 1, wherein the descending interconnections have a longest dimension in a direction substantially the same as the direction of the longest dimension of the conductive lines.

5. The apparatus of claim 1, wherein the controller is configured to control discharging the equalized access lines of the block of memory array to a ground reference potential.

6. The apparatus of claim 1, wherein the controller is configured to control discharging the equalized access lines of the block of memory array to potentials different than a ground reference potential.

7. The apparatus of claim 1, wherein the controller is configured to control equalizing potential of a select gate line for the block of the memory array after the number of operations is completed.

8. The apparatus of claim 7, wherein the controller is configured to control discharging the equalized select gate line of the block of memory array to a ground reference potential.

9. The apparatus of claim 7, wherein the controller is configured to control discharging the equalized select gate line of the block of memory array to a potential different than a ground reference potential.

10. An apparatus, comprising:
a memory array having access lines with a wide width portion and a narrow width portion, the access lines coupled to a plurality of memory cells and control circuitry, wherein the control circuitry is configured to:
perform a read or write operation; and
equalize potential of access lines after the read or write operation is performed,
wherein the access lines are coupled to the plurality of memory cells at least at the wide width portion of the access lines, and wherein the access lines are coupled to the control circuitry through ascending and descending interconnections coupled to top planar interconnections.

11. The apparatus of claim 10, wherein the control circuitry is configured to discharge potential of equalized access lines to a ground reference potential.

12. The apparatus of claim 10, wherein the control circuitry is configured to equalize select gate lines of the memory array to the equalized potential of access lines after the read or write operation is performed.

13. The apparatus of claim 12, wherein the control circuitry is configured to discharge potential of select gate lines to a ground reference potential.

14. A method of operating a memory, comprising:
performing a read operation or a program operation;
equalizing potential of access lines for a block of a memory array after the read operation or the program operation is completed,
wherein the memory is a three dimensional memory array including a stack of conductive lines with a wide width portion and a narrow width portion, the narrow width portion having a stair step structure.

15. The method of claim 14, wherein the stack of conductive lines is coupled to circuitry below the memory array through top planar interconnections coupled between ascending interconnections and descending interconnections, the top planar interconnections have a longest dimension in a direction different from a direction of a longest dimension of the conductive lines.

16. The method of claim 14, further comprising discharging the equalized access lines of the block of memory array to a ground reference potential.

17. The method of claim 16, further comprising discharging select gate lines of the block of memory array to a ground reference potential.

18. The method of claim 14, further comprising discharging the equalized access lines of the block of memory array to a potential different than a ground reference potential.

19. The method of claim 17, wherein discharging select gate lines includes coupling select gate lines to access lines.

20. The method of claim 14, comprising biasing potential of select gate lines to a potential different than the potential of equalized access lines.

\* \* \* \* \*